United States Patent
De Souza et al.

(10) Patent No.: US 7,723,758 B2
(45) Date of Patent: May 25, 2010

(54) METHOD FOR DOPANT CALIBRATION OF DELTA DOPED MULTILAYERED STRUCTURE

(75) Inventors: Patricia Lustoza De Souza, Rio de Janeiro (BR); Christiana Villas-Bôas Tribuzy, Rio de Janeiro (BR); Maurício Pamplona Pires, Rio de Janeiro (BR); Sandra Marcela Landi, Rio de Janeiro (BR)

(73) Assignee: Ericsson Telecomunicacoes S.A., Sao Paulo (ES)

( * ) Notice: Subject to any disclaimer, the term of this patent is extended or adjusted under 35 U.S.C. 154(b) by 99 days.

(21) Appl. No.: 11/667,468

(22) PCT Filed: Nov. 11, 2004

(86) PCT No.: PCT/BR2004/000222

§ 371 (c)(1),
(2), (4) Date: Apr. 4, 2008

(87) PCT Pub. No.: WO2006/050590

PCT Pub. Date: May 18, 2006

(65) Prior Publication Data
US 2008/0296556 A1  Dec. 4, 2008

(51) Int. Cl.
*H01L 31/00* (2006.01)
(52) U.S. Cl. .............. 257/269; 257/17; 257/E33.017; 438/510
(58) Field of Classification Search ........................ None
See application file for complete search history.

(56) References Cited

OTHER PUBLICATIONS

Tribuzy et al., "Delta-doping superlattices in multiple quantum wells", 2001, Physica E 11 (2001) 261-267.*
International Search Report mailed Dec. 12, 2005.
International Preliminary Report on Patentability dated Feb. 22, 2007.
International Search Report for PCT/BR2004/000222.
Written Opinion for PCT/BR2004/000222.
Theron et al.; "Characterization of GaAs and InGaAs Double-Quantum Well Heterostructure FETs"; Nov. 1993; vol. 40, No. 11; pp. 1935-1940.
Tribuzy et al.; XP-002355250; "Delta-doping superlattices in multiple quantum wells"; 2002; Physica E; pp. 261-267.
Landi et al.; XP-002355251; "Photoluminescence of FaAs/$Al_x Ga_{1-x}$As multiple quantum well structures containing $\delta$-doping superlattices"; 2003; Physical Review B 67 085304; pp. 1-10.
Tribuzy et al.; "Effect of A *nipi* Delta-Doping Superlattice on . . . "; Microwave and Optical Technology Letters; Oct. 20, 2004; vol. 3, No. 2, pp. 168-173.
Tribuzy et al.; XP-002355253; "*nipi* Delta-Doping Superlattices for Amplitude Modulation"; Brazilian Journal of Physics, vol. 32, No. 2A, Jun. 2002; pp. 269-274.
Batty et al.; "Enhanced electroabsorption characteristics in $\delta$-doped quantum well optical modulators"; Electronics Letters; Nov. 11, 1993; vol. 29, No. 23; pp. 2066-2077.

* cited by examiner

*Primary Examiner*—Evan Pert
*Assistant Examiner*—Scott R Wilson
(74) *Attorney, Agent, or Firm*—Nixon & Vanderhye P.C.

(57) ABSTRACT

In a calibration method, the relation between dopant concentrations of $\delta$-doping layers in a multilayered semiconductor structure and process parameters is determined S1 based on multiple bulk specimens of the material in which the $\delta$-doping layers are located. A desired dopant concentration is selected S2, and the semiconductor structure with predetermined doping levels can be generated S3 based on the relation between the process parameters and the predetermined doping concentrations.

21 Claims, 9 Drawing Sheets

METHOD FOR DOPANT CALIBRATION OF DELTA DOPED MULTILAYERED STRUCTURE

This application is the U.S. national phase of International Application No. PCT/BR2004/000222 filed 11 Nov. 2004 which designated the U.S. the entire content of which is hereby incorporated by reference.

TECHNICAL FIELD

The technology described herein relates to semiconductors in general, specifically to calibration of the dopant levels of nipi-δ-doping superlattices in multiple quantum well structures.

BACKGROUND

Recent demands for multi-terabit communication require external amplitude modulators operating at low voltages. Amplitude modulators based on the Quantum Confined Stark Effect (QCSE) in Group III-V semiconductors multiple quantum well (MQW) systems are suitable for meeting these technological demands and, therefore much attention has been devoted to their development. One of the crucial requirements for efficient modulation at high bit rates is that the change in absorption per applied voltage is as large as possible. In other words, the Stark shift should be maximized. The larger the quantum well the larger the Stark shift. However, increasing the quantum well width decreases the oscillator strength for absorption. Thus, a compromise is imposed.

An alternative for increasing the Stark shift has been proposed by Batty and Allsop [1]. They have theoretically shown that the introduction of a so called nipi-δ-doping superlattice in a MQW structure where the quantum well is n-δ doped while the barrier is p-δ doped, may double the Stark shift.

δ-doping is a doping technique that attempts to spatially confine the dopant impurities to one or a few atomic layers during epitaxial growth of semiconductors. The basic idea of δ-doping superlattices is to create a periodic band edge modulation in real space without changes in the chemical composition of the semiconductor. There are several possible layer schemes which create a band edge modulation. One example is the nipi-δ-doping superlattice, which consists of a series of alternating n-type and p-type δ-doping layers separated by intrinsic layers. This type of superlattice causes a saw tooth shaped potential profile in the MQW-structure. The δ-doping layers are separated by the same distance, where, if the barrier between the doping planes is small enough, interaction is possible between the electronic wave functions of the neighboring δ-doping layers.

If the nipi-MQW structures are to be used in amplitude modulators, some requirements should be fulfilled. The presence of the nipi-δ-doping superlattice should not introduce energy levels in the forbidden gap, otherwise, in the ON state of the device, light could be absorbed, thereby dramatically increasing insertion losses. For applications where the MQW-structure forms the active region of the device, it is crucial that the net doping corresponds to an undoped structure, so that the applied electric field is uniformly distributed over the entire MQW region. It is therefore essential to balance out the electron and the hole concentrations in the δ-layers. However, the required balance between n-type doping levels and p-type doping levels is not trivial to achieve due to the presence of interface hole traps whose population depends on the quantum well doping concentration.

Prior art semiconductor amplitude modulators are adapted for 2.5 or 10 GHz. In order to reach higher frequencies (use lower ac voltages) it is fundamental that the Stark shift, and consequently the change in absorption, is larger.

SUMMARY

It is an object of the invention to enable calibration of the dopant levels of δ-doping layers in a multilayered semiconductor structure.

It is a specific object of the invention to enable calibration of the dopant levels of a nipi-δ-doping superlattice in a multiple quantum well structure.

It is another specific object to enable a multiple quantum well structure with a nipi-δ-doping superlattice with balanced concentrations of n-dopants and p-dopants.

It is a further specific object to enable an improved optical amplitude modulator.

It is another specific object to enable an amplitude modulator with improved Stark shift.

These and other objects are achieved in accordance with the attached claims.

Briefly, the technology described herein includes calibrating the dopant concentrations of the δ-doping layers in a multilayered semiconductor structure by introducing corresponding δ-doping layers in multiple bulk specimens of the material in which the δ-doping layers are located, wherein the δ-doping layers in the bulk specimens have a periodicity corresponding to the periodicity of the δ-doping layers in the desired multilayered semiconductor structure. Based on the bulk specimens the process parameters for achieving a predetermined doping concentration are determined, and the semiconductor structure with predetermined doping levels can be generated based on the relation between the process parameters and the predetermined doping concentrations.

Specifically, the technology described herein includes calibrating the n-type and p-type δ-doping layers in a MQW-structure with a nipi-δ-doping superlattice, based on bulk specimens of the quantum well material with corresponding n-type δ-doping layers and bulk specimens of the barrier material with corresponding p-type δ-doping layers, whereby the relation between the process parameters and the dopant levels is determined. Subsequently, the MQW structure with predetermined dopant levels can be generated based on the determined relation.

Example advantages of the technology described herein comprise:

An improved calibration of the dopant levels of δ-doping layers in a multilayered semiconductor structure.
An improved amplitude modulator.
A MQW structure with enhanced Stark effect.
A MQW structure with balanced dopant levels.

DETAILED DESCRIPTION

One of the problems with prior art, as identified by the inventors, is to optimize multilayered semiconductor structures for improved performance of amplitude modulators in optical communication systems, both in terms of speed and of distance between repeaters. Different structures have been proposed in prior art to improve the performance of such devices, including the introduction of δ-doping superlattices.

In order to obtain a larger Stark shift, as predicted by Batty and Allsopp [1], a nipi-δ-doping superlattice should be introduced in a multiple quantum well structure (MQW). However, the n-doping levels and p-doping levels should be as close as possible, since the MQW region of an amplitude modulator structure should be essentially intrinsic, otherwise a residual electric field will appear and prevent the observation of a Stark shift. The residual electric field appears due to the ionized charge left behind because the doping impurities lose their extra carrier to the conduction and valence bands, where they will behave as mobile free carriers. Therefore, the concentration of these ionized impurities should indeed be balanced out.

The technology described herein will be described in the context of a multiple quantum well structure including a nipi-δ-doping superlattice. In this case, the quantum wells each comprise GaAs with a centrally located n-δ-doping layer of Si and the barriers each comprise AlGaAs with a centrally located p-δ-doping layer of C. However, the technology described herein is not limited to this type of structure but can be implemented for any multilayered semiconductor structure with δ-doping layers; preferably the materials are chosen among Group III-V compounds.

However, the technology described herein is not limited to the problem of achieving balanced amounts of dopants, but equally applicable to situations where predetermined amounts of dopants (n-type and/or p-type) are required.

The inventors have, according to the invention, demonstrated that the Stark shift essentially doubles (an improvement of 1.8 has been observed) with the introduction of a δ-doping superlattice, which implies an improvement of the contrast ratio of the device. In principle, this means that higher frequencies could be reached. Also, the chirp obtained is closer to 0, meaning that longer distances can be reached.

The reason these results have not been obtained previously is because a thorough calibration of the doping level is required for the observation of the effect. Since there are alternating n and p doping layers in the intrinsic region of the device, the total charge in this region should add to zero, in other words n should equal p, which is not trivial to achieve. In order to achieve that, one should calibrate the fixed charge concentration in the region and not the free carrier concentration, as is normally done in prior art.

The problem with the calibration of the doping levels is that the typical way, according to prior art, is to calibrate the concentration of free electrons for a MQW-structure with only n-δ-doped quantum wells and of free holes for a MQW-structure with only p-δ-doped barriers. With this calibration one could, in principle, grow the MQW-structure with the same doping level in the wells (type n) and in the barriers (type p), thereby obtaining an essentially intrinsic structure. However, holes and electrons can be trapped in the interfaces not contributing to measurements of free carriers, as identified by the inventors [2]. But the impurity which has freed the charge carrier is left ionized and will contribute to a residual electric field. Therefore, calibrating the doping level in the MQW-structure is not the optimal way to do it. This discussion is given in more detail in [3].

A doping balance is needed to observe the enhancement on the Stark effect of the samples with a multiple quantum well structure of GaAs/AlGaAs containing a nipi-δ-doping superlattice. The GaAs quantum wells are doped at the center with a "plane" of Si impurities, giving rise to a layer of type n.

The impurities are distributed in a width of the order of 1 nm. The AlGaAs internal barriers are also doped at the center with a "plane" of C impurities, giving rise to a layer of type p. The impurities, Si and C, are ionized at room temperature, meaning that they lose an electron or a hole and remain positively and negatively charged, respectively. Therefore, a plane of fixed negative and a plane of fixed positive charges are introduced in the quantum well and barrier with the nipi-δ-doping superlattice. The concentration of fixed positive charge should be equal or as close as possible to the concentration of fixed negative charge.

Also, according to prior art, in order to calibrate these charge concentrations, initially the concentration of free electrons is measured using Hall effect measurements on samples of a GaAs/AlGaAs MQW-structure containing a Si δ-doping layer at the center of the quantum wells and undoped barriers, assuming that the free electron concentration will be the same as the concentration of ionized Si atoms. This implies that each Si impurity gives rise to a free electron and turns into an ionized donor. With a set of samples with different doping levels, one determines the growth conditions for the desired free electron concentration.

The same procedure, according to prior art, is utilized for the AlGaAs doped with C. The concentration of free holes using Hall effect measurements is determined for samples of GaAs/AlGaAs multiple quantum wells containing a C δ-doping layer at the center of the barriers and undoped quantum wells. This implies that each C impurity gives rise to a free hole and turns into an ionized acceptor. With a set of samples with different doping levels the growth conditions for the same desired free hole concentration is determined. With these known growth conditions, it should be possible to grow GaAs/AlGaAs multiple quantum wells with Si δ-doped GaAs quantum wells and C δ-doped AlGaAs barriers containing exactly the same electron and hole concentrations. Note that the external barriers should have half the concentration of the doping of the internal barriers. However, if there are interface traps or any other kind of free carrier traps, the concentration of free charges will be smaller than the concentration of ionized impurities and a balance of the free charges will not correspond to a balance of fixed charges.

The inventors have identified that a majority of the trapped free carriers are located at interface states, i.e. the interfaces between the quantum well layers and the barrier layers. Therefore, it was decided to try another method of calibration in which the influence of the interfaces is limited and possibly eliminated.

Figure 1:
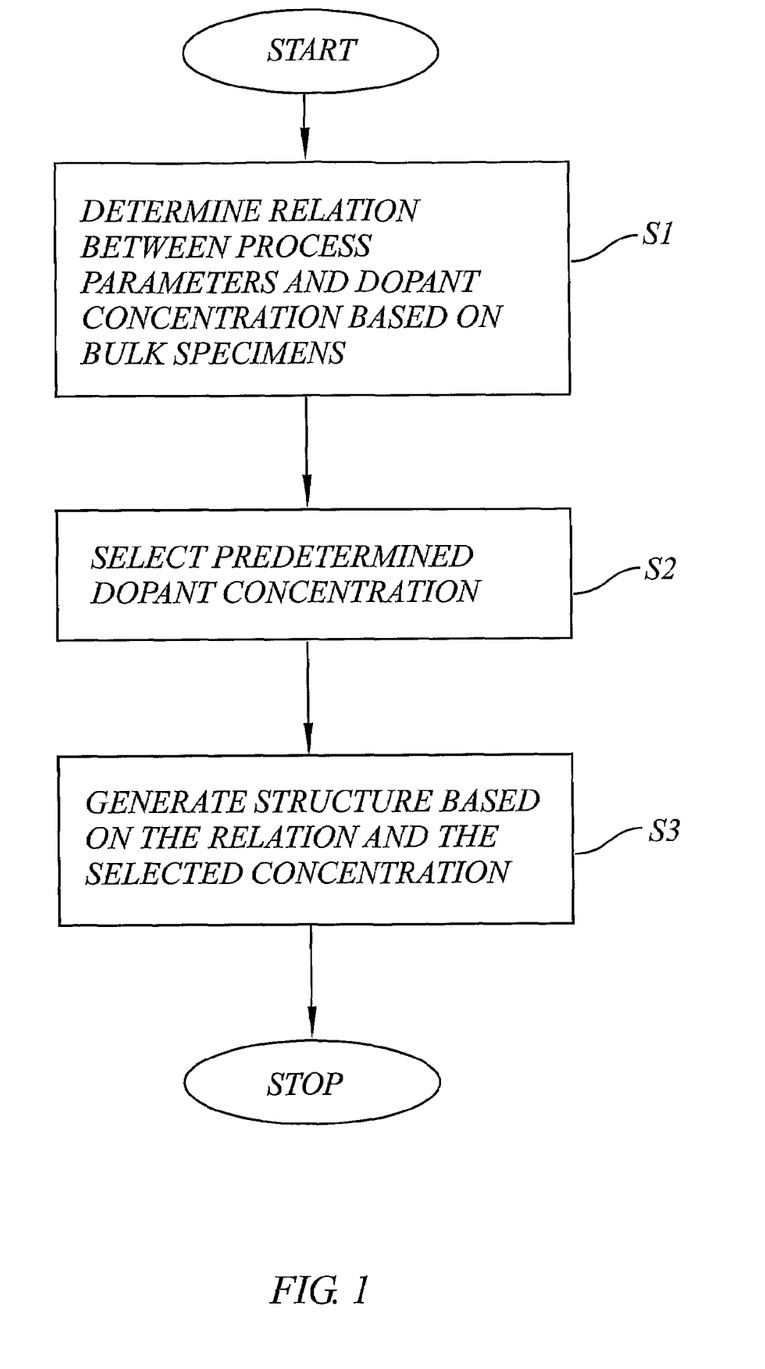
FIG. 1 is a flow diagram of an example embodiment of a method.

An example embodiment of a method will be described with reference to FIG. 1. The δ-doping levels for at least two centrally located δ-doping layers in a multilayered semiconductor structure are calibrated based on bulk specimens of essentially homogeneous composition of the material of the layers in which the δ-doping layers are located. A series of bulk specimens of the material in question are generated, where the specimens include δ-doping layers. The specimens are generated with different process parameters, whereby the concentration of dopants is varied. Consequently, the relation between the process parameters i.e. dopant flux, and the dopant concentration is determined S1. Then, a desired dopant concentration for the δ-doping layers of the multilayered semiconductor structure is selected S2. Finally, the multilayered semiconductor structure with included δ-doping layers is generated S3, based on the selected dopant concentration and the determined relation between dopant concentration and process parameters.

Figure 2:
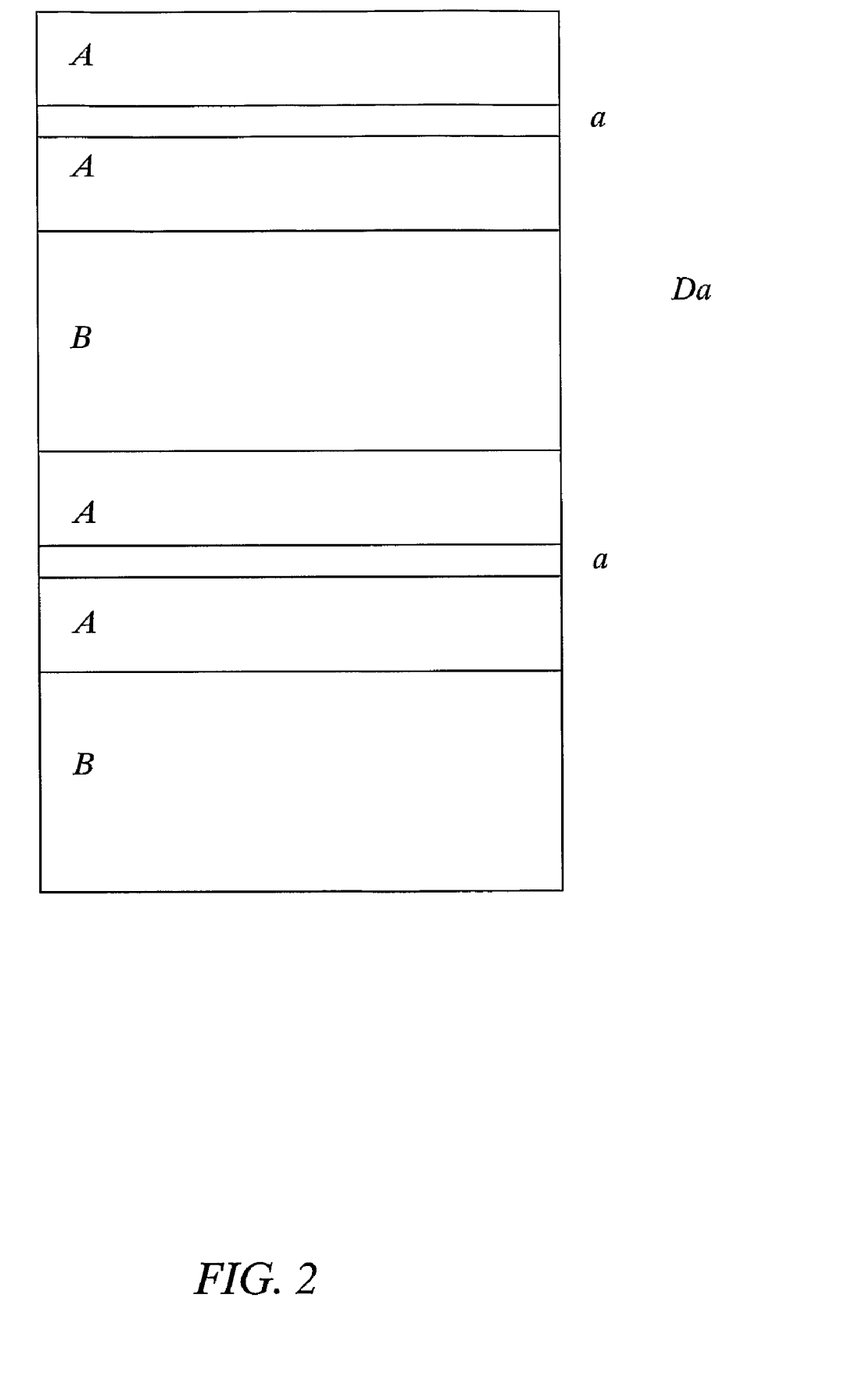
FIG. 2 is a schematic illustration of an example embodiment of a multilayered semiconductor structure with δ-doping layers.

FIG. 2 illustrates such a multilayered semiconductor structure generated according to the method above. The structure comprises alternating layers of different materials A, B. Also, δ-doping layers a are centrally located in some of the layers A. The distance between the respective δ-doping layers is Da.

Figure 3:
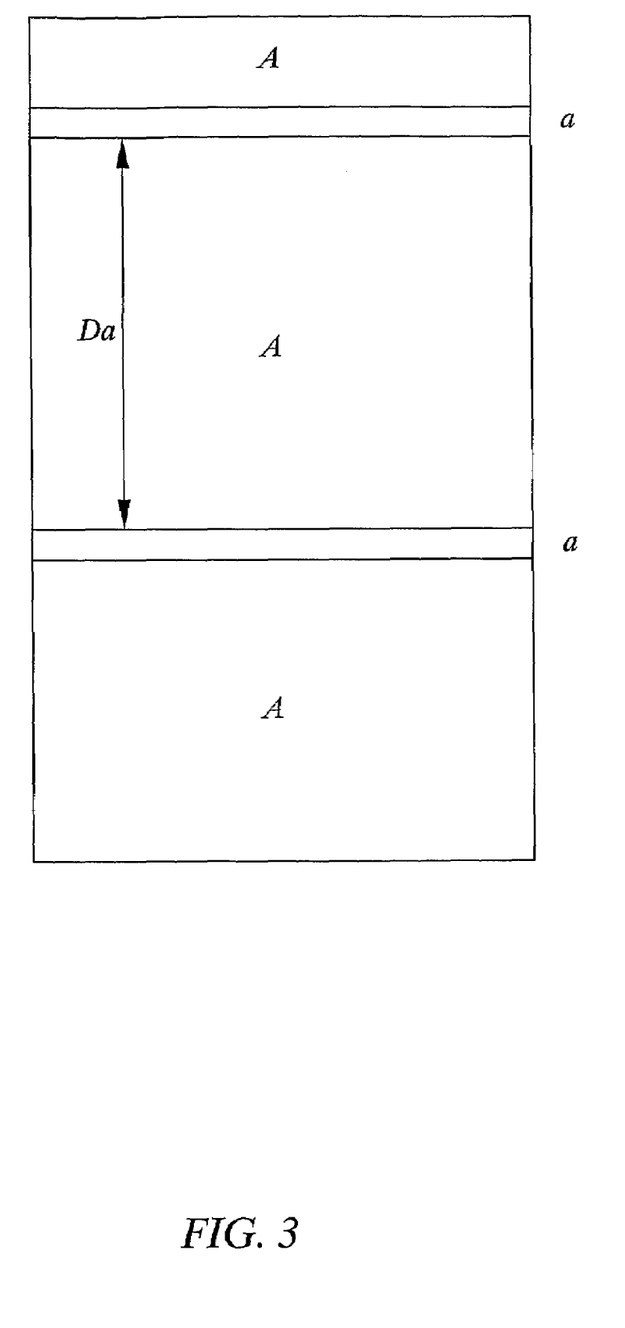
FIG. 3 is schematic illustration of an example embodiment of a bulk specimen with δ-doping layers.

FIG. 3 illustrates one of multiple bulk specimens generated in order to calibrate the dopant levels of the multilayered structure of FIG. 2. Each of the bulk specimens comprises the material of the layers of the multilayered structure in which the δ-doping layers a are present, in this case material A. Also, the bulk specimen comprises δ-doping layers a with a corresponding periodicity or distance Da as the desired multilayered structure.

The term corresponding is used in the sense that the periodicity or distance of the δ-doping layers in the bulk specimen have the same order of magnitude as the periodicity of the δ-doping layers in the multilayered structure.

The above described embodiment enables a precise calibration of the doping levels of the δ-doping layers a. However, in order to solve the problem of enabling a Stark effect δ-doping layers have to be introduced in the majority of the layers in the multilayered structure. As, stated in the background, what is needed is a MQW structure with a nipi-δ-doping superlattice. An embodiment of this will be described below.

Another example embodiment will be described below with reference to FIG. 4 which corresponds to the embodiment of FIG. 1 with a few exceptions. According to this embodiment, two determining steps S10, S11 are performed instead of one. Consequently, the two series enables determination of the relation between process parameters and n-type dopant concentration S10, and p-type dopant concentration S11 respectively. The desired concentrations for the n-type dopant and the p-type dopant are selected S20, S21. Finally, the multilayered structure is generated based on the determined relations and the selected concentrations.

Figure 5:
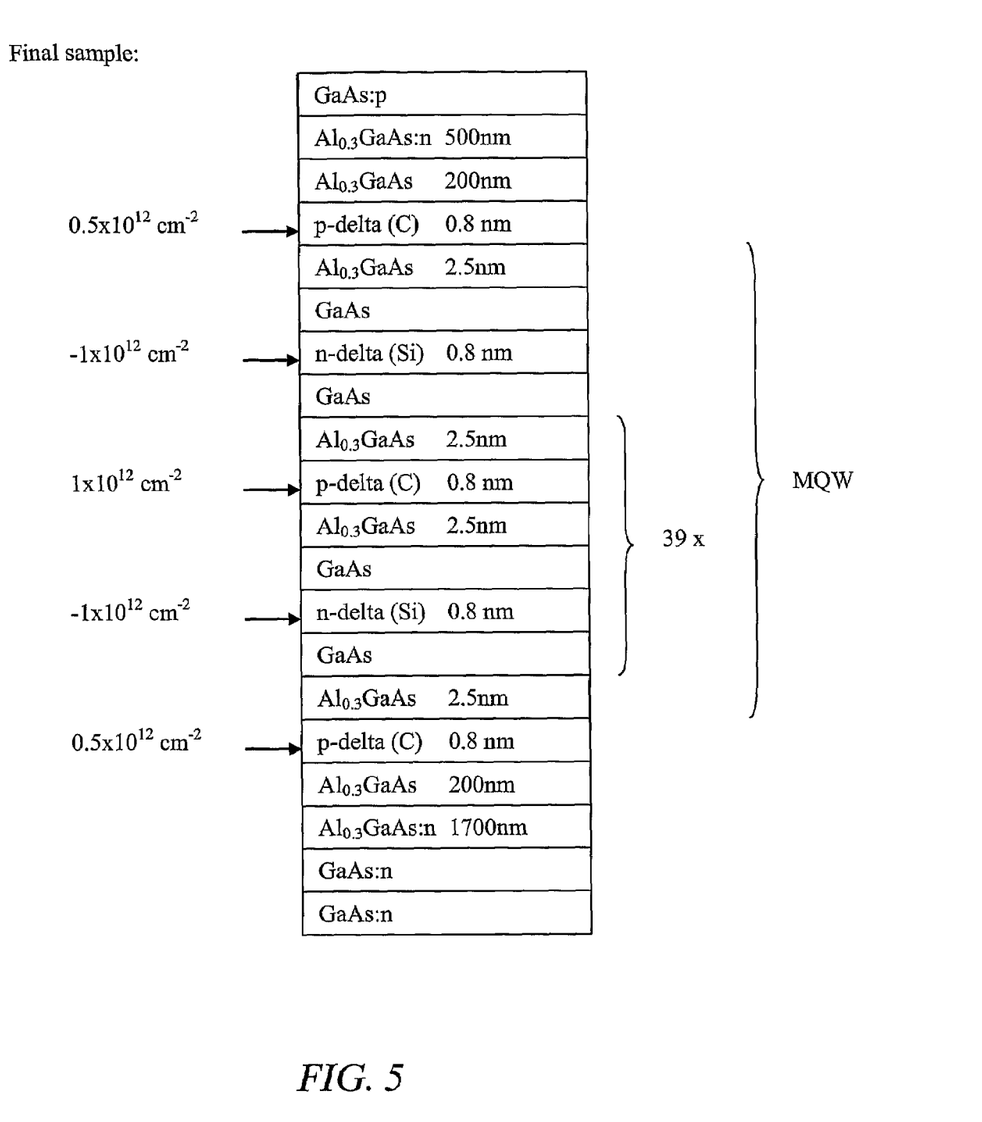
FIG. 5 is a schematic illustration of a specific example embodiment of a multilayered semiconductor structure with δ-doping layers.

According to another specific method of this embodiment, with reference to FIG. 5, the structure in which to calibrate dopant levels comprises a multiple quantum well structure with a δ-doping superlattice of alternating n-type and p-type δ-doping layers. Basically, in this embodiment the n-doping and p-doping levels are calibrated in the bulk material and not in the MQW structure. In this case there are no interfaces and the free charge is essentially equal to the ionized impurity concentration. So, calibrating the n-doping in the quantum well material, e.g. GaAs, and the p-doping in the barrier material, e.g. AlGaAs, it is possible to reach a much better balance between the ionized donors and acceptors in the final MQW structure. Any remaining free carriers can be swept out of the MQW region by applying a dc pre-bias.

The structure of FIG. 5 also contains layers not forming part of the MQW active region and are not limiting, but merely show an example MQW structure. It is apparent to someone knowledgeable in the technical field that the MQW structure can be surrounded by a plurality of different layers. Also, it is apparent that the actual number of layers can be.

Figure 4:
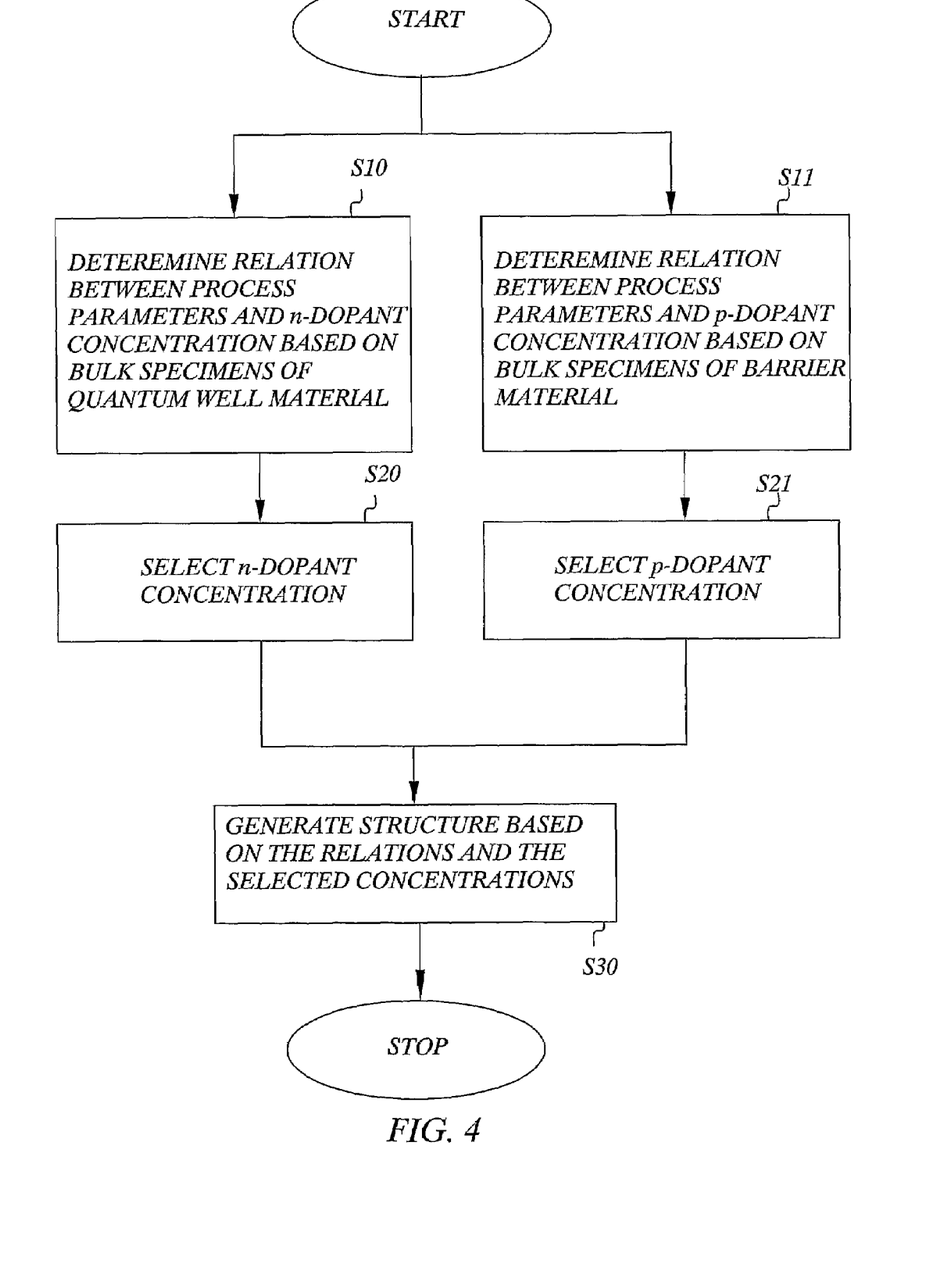
FIG. 4 is a schematic flow diagram of another example embodiment of a method.
Figure 6:
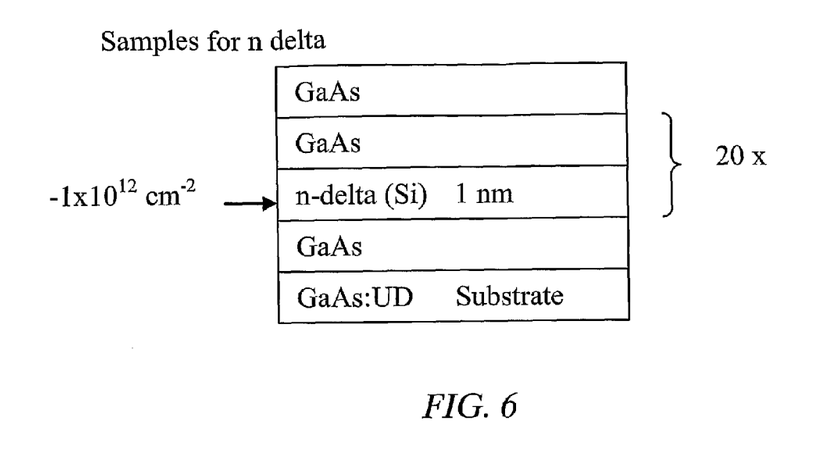
FIG. 6 is schematic illustration of a specific embodiment of a bulk specimen with δ-doping layers.

With reference to FIG. 4 and FIG. 6, according to the embodiment, a series of GaAs bulk samples (no quantum wells or barriers) with δ-doping planes of Si impurities (different silane fluxes) are grown with the same period as that for the multiple quantum well structures and the free electron concentration is measured. In the absence of interfaces, fewer carriers are trapped, if any. In this case the free electron concentration is much closer to the concentration of ionized Si atoms. With a set of samples grown with different Si concentrations it is possible to determine S10 the growth conditions or process parameters to achieve a certain free electron concentration or fixed negative charge concentration (Si ions).

Figure 7:
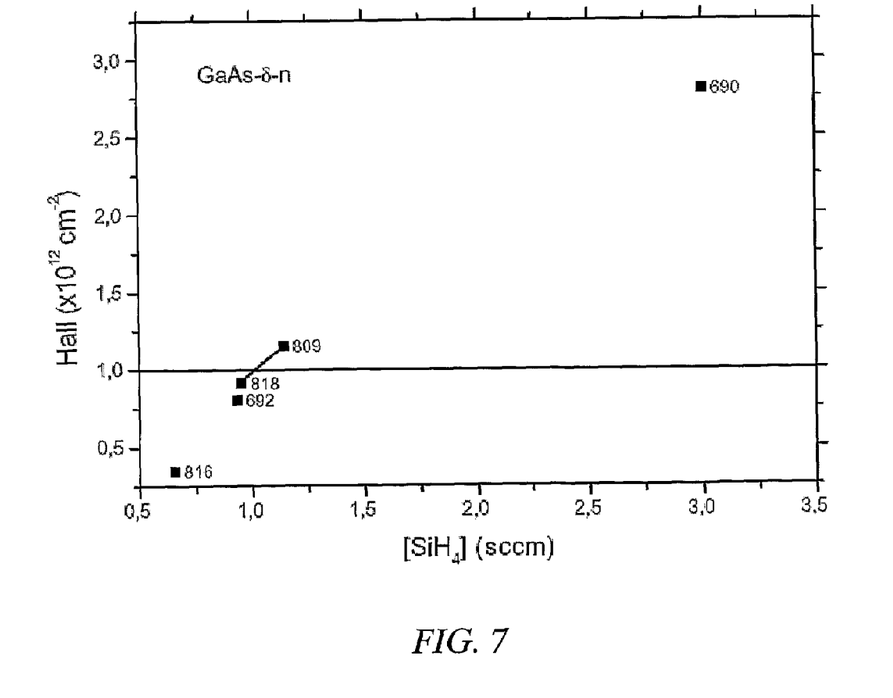
FIG. 7 is a calibration curve for the bulk specimen of FIG. 6.

The relation between the process parameters e.g. SiH4-flux and the dopant concentration (as represented by Hall measurements) is illustrated but not limited by the calibration curve in FIG. 7.

Figure 8:
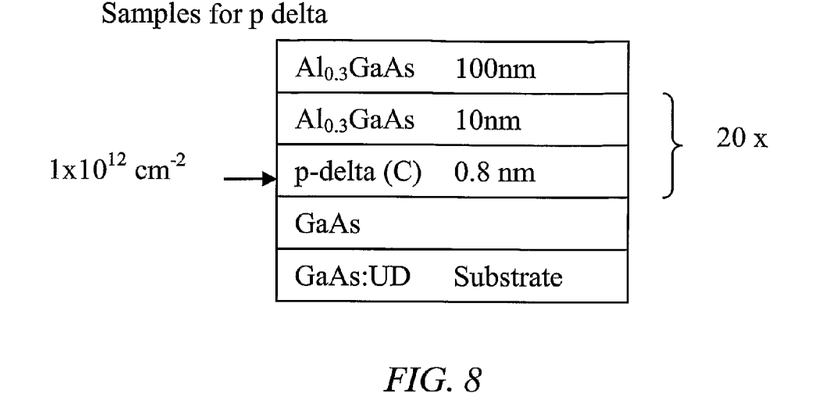
FIG. 8 is a schematic illustration of another specific example embodiment of calibration bulk specimens with δ-doping layers.

With reference to FIG. 4 and FIG. 8, the same procedure is used for calibrating the p-type material. Correspondingly, a series of bulk AlGaAs samples (no quantum wells or barriers) with planes of C impurities (different $CBr_4$ fluxes) with the same period as that for the multiple quantum well structures were grown and the free hole concentration was measured. In the absence of interfaces, fewer carriers are trapped, if any. In this case the free hole concentration is much closer to the concentration of ionized C atoms. With a set of samples grown with different C concentrations it was possible to determine the growth conditions or process parameters S11 to achieve a certain predetermined free hole concentration or fixed positive charge concentration (C ions).

Figure 9:
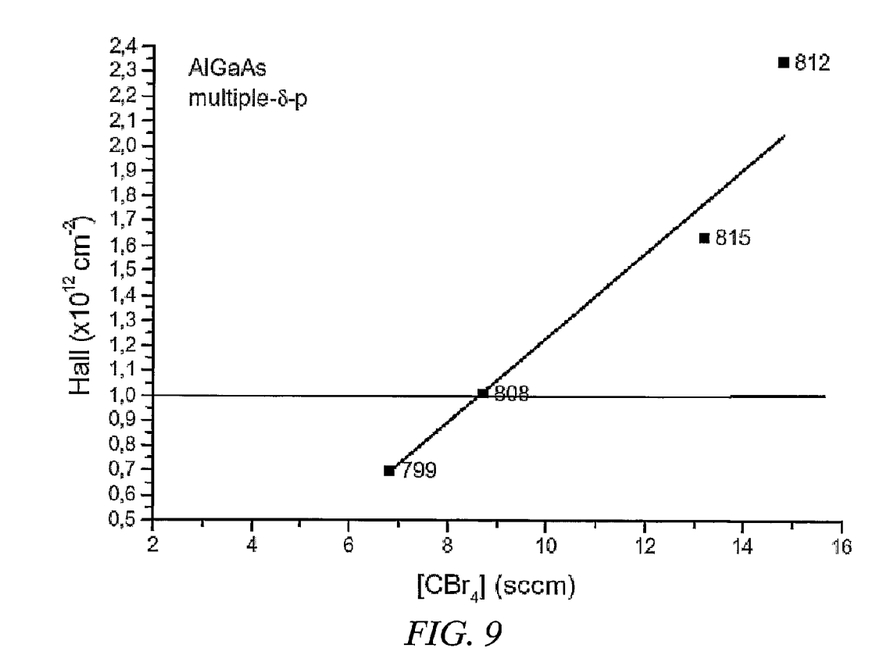
FIG. 9 is a calibration curve for the bulk specimen of FIG. 8.

The relation between the process parameters e.g. CBR4-flux and the dopant concentration (as represented by Hall measurements) is illustrated but not limited by the calibration curve in FIG. 9.

Once again referring to FIG. 4 and FIG. 5, using the, then known, growth conditions to achieve a specific S20, S21 positive and negative fixed charge concentration for p-doping and n-doping, the multiple quantum well structure is grown S30 containing the nipi-δ-doping superlattice. In this structure, the fixed positive and negative charge concentrations are essentially equal, meaning that the total fixed charge concentration is essentially zero, as it should be to avoid the presence of a residual electric field. Typically, the two external barriers have half the charge concentration of the internal barriers. Note that the free charge concentration is not zero because the free electron and free hole concentrations are not equal, a fraction of the free carriers are trapped and certainly not the same fraction for electrons as for holes. This is not a problem because the excess free carrier concentration is swept out of the multiple quantum well region by the use of an externally applied dc electric field.

Although the embodiment has been described with equal or balanced amounts of dopants, it is equally possible to generate a multilayered structure with unequal dopant levels if it is necessary for some other application.

Only for samples for which this calibration method is used is it possible to observe a Stark shift.

Figure 10:
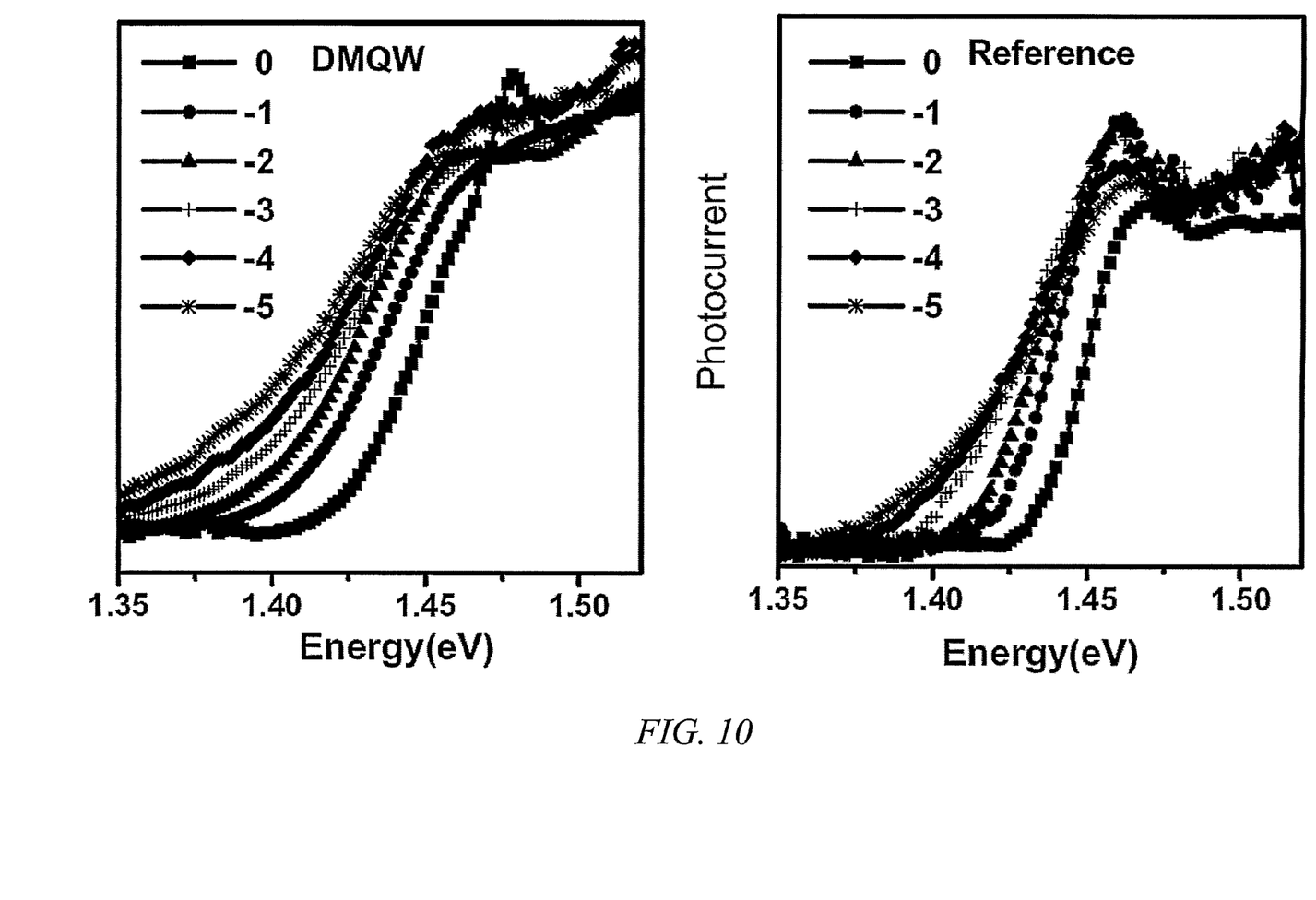
FIG. 10 is a comparison of the photocurrent between prior art and an example embodiment.

FIG. 10 shows the photocurrent spectra for the sample containing the nipi-delta-doping superlattice (DMQW) and for a reference sample (the same multiple quantum well structure but without the doping layers). As the reverse voltage increases, the curves are shifted to lower energies. This shift is the so-called Stark shift, which can be observed for the DMQW when a good balance of the doping is achieved. Otherwise, no shift can be observed.

Figure 11:
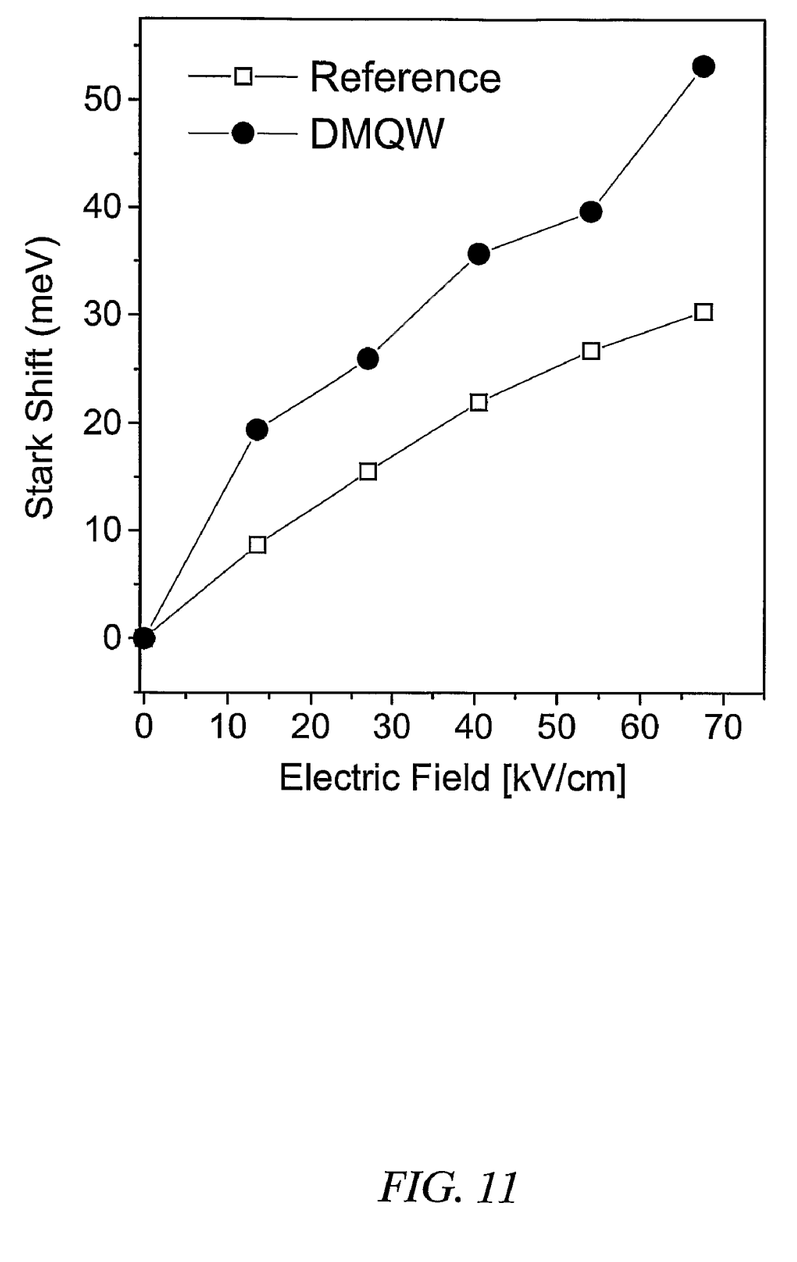
FIG. 11 is another comparison of the Stark effect between prior art and the embodiment according to FIG. 10.

The data for FIG. 11 are taken from FIG. 10 and it shows the Stark shift, the shift of absorption towards lower energies, as a function of the applied reverse electric field for the structure containing the nipi delta doping superlattice and for the reference sample.

This is the first time that a good balance of the charge is achieved and that a Stark shift for this type of structure is reported. Moreover, it has been shown that these structures have a chirp between 0 and −1, more convenient than that of an undoped structure, which can reach values above 5. More recently, with a more careful doping control results have been obtained showing that the Stark shift is essentially twice as large as that for the undoped structure, as originally predicted by Batty and Allsopp [1].

It will be understood by those skilled in the art that various modifications and changes may be made to the present invention without departure from the scope thereof, which is defined by the appended claims.

REFERENCES

[1] Batty and D. W. E. Allsopp: Electron. Lett., 29, 2066 (1993).
[2] C. V.-B. Tribuzy, S. M. Lansi, M. P. Pires, R. Butendeich, P. L. Souza: *nipi Delta-Doping Superlattices for Amplitude Modulation*, Braz. J. Phys. v.32.n.2a, June, 2002.
[3] C. V.-B. Tribuzy, P. L. Souza, S. M. Landi, M. P. Pires, R. Butendeich: *Delta-doping superlattices in multiple quantum wells*, Physica E, 11, p 261-267, 2001.

The invention claimed is:

1. A method for calibrating the doping levels for at least two δ-doping layers included in a multilayered semiconductor structure, comprising:
    determining the relation between process parameters and doping levels for the at least two δ-doping layers, based on multiple bulk specimens with corresponding at least two δ-doping layers, wherein said bulk specimens have a homogeneous composition;
    selecting a predetermined doping level for the at least two δ-doping layers in the multilayered structure; and
    generating the multilayered structure and the at least two δ-doping layers, based on at least the selected predetermined doping levels and the determined relation between the process parameters and the doping level.

2. The method according to claim 1, wherein determining the relation between the process parameters and the doping levels comprises:
    generating said multiple bulk specimens with different process parameters, whereby the doping level of the at least two δ-doping layers is varied.

3. The method according to claim 1, wherein said semiconductor structure comprises at least two n-type δ-doping layers and at least two p-type δ-doping layers; and
    said determining step comprising:
        determining the relation between process parameters and doping levels for the at least two n-type δ-doping layers, based on a first series of multiple bulk specimens with corresponding n-type δ-doping layers, wherein said bulk specimens have a homogeneous composition;
        determining the relation between process parameters and doping levels for the at least two p-type δ-doping layers, based on a second series multiple bulk specimens with corresponding p-type δ-doping layers, wherein said bulk specimens have a homogeneous composition; and said selecting step comprising:
    selecting predetermined doping levels for the at least two n-type δ-doping layers and the at least two p-type δ-doping layers in the multilayered structure, and
    said generating step comprising:
        generating the multilayered structure with the at least two n-type δ-doping layers and with the at least two p-type δ-doping layers, based on at least the selected predetermined doping levels and the determined relation between the process parameters and the respective doping levels.

4. The method according to claim 3, wherein determining the relation between the process parameters and the doping levels for the n-type δ-doping layers and the p-type δ-doping layers comprises:
    generating said first and second multiple bulk specimens with different process parameters, whereby the doping level of the at least two n-type δ-doping layers and the at least two p-type δ-doping layers is varied.

5. The method according to claim 3, comprising selecting equal predetermined concentrations of said n-dopant and said p-dopant.

6. The method according to claim 1, wherein the multilayered semiconductor structure comprises a multiple quantum well structure with alternating layers of quantum well material and barrier material.

7. The method according to claim 6, wherein the p-dopant layers in the bulk specimens of the barrier material have a corresponding periodicity as the p-dopant layers in the multiple quantum well structure.

8. The method according to claim 6, wherein the n-doped layers in the bulk specimens of the well material have a corresponding periodicity as the n-doped layers in the multiple quantum well structure.

9. The method according to claim 6, wherein said quantum well material is GaAs.

10. The method according to claim 6, wherein said n-dopant comprises Si.

11. The method according to claim 6, wherein said barrier material is AlGaAs.

12. The method according to claim 6, wherein said p-dopant is C.

13. The method according to claim 6, wherein said quantum well material and said barrier material are selected from Group III-V compounds.

14. The method according to claim 1, wherein the δ-doping layers of the bulk specimens have the same periodicity as the corresponding layers in the multilayered semiconductor structure.

15. The method according to claim 1, wherein said process parameters comprise dopant flux.

16. The method according to claim 1, wherein said relation is represented by a calibration curve.

17. The method according to claim 1, wherein the calibration curve represents the relation between the free carrier concentration and the flux of the dopant.

18. A method for generating a multilayered semiconductor structure including at least two δ-doping layers, comprising:
    determining the relation between process parameters and doping levels for the at least two δ-doping layers, based on multiple bulk specimens with corresponding at least two δ-doping layers, wherein said bulk specimens have a homogeneous composition;

selecting a predetermined doping level for the at least two δ-doping layers in the multilayered structure; and generating the multilayered structure and the at least two δ-doping layers, based on at least the selected predetermined doping levels and the determined relation between the process parameters and the doping level.

19. A multiple quantum well structure including a nipi-δ-doping superlattice, wherein the dopant levels of the at least two δ-doping layers are calibrated according to the method of claim 1 or claim 18.

20. A multilayered semiconductor structure including at least two δ-doping layers, wherein the dopant levels of the at least two δ-doping layers are calibrated according to the method of claim 1 or claim 18.

21. The method according to claim 18, wherein determining the relation between the process parameters and the doping levels comprises:

generating said multiple bulk specimens with different process parameters, whereby the doping level of the at least two δ-doping layers is varied.

* * * * *